United States Patent
Kappes et al.

(10) Patent No.: US 7,433,656 B2
(45) Date of Patent: Oct. 7, 2008

(54) REDUCING FLICKER NOISE IN TWO-STAGE AMPLIFIERS

(75) Inventors: Michael Steven Kappes, San Diego, CA (US); Arya Reza Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 476 days.

(21) Appl. No.: 11/327,955

(22) Filed: Jan. 9, 2006

(65) Prior Publication Data

US 2007/0077909 A1    Apr. 5, 2007

Related U.S. Application Data

(60) Provisional application No. 60/722,490, filed on Sep. 30, 2005.

(51) Int. Cl.
*H04B 1/04* (2006.01)
*H04B 15/00* (2006.01)

(52) U.S. Cl. ............... 455/114.2; 455/63.1; 455/67.13; 455/127.3; 455/333; 330/283; 330/307

(58) Field of Classification Search ............... 455/63.1, 455/67.11, 67.13, 114.2, 127.1, 127.2, 127.3, 455/333, 552.1, 553.1; 330/250, 253, 258, 330/261, 277, 283, 285, 295, 296, 307, 310
See application file for complete search history.

(56) References Cited

U.S. PATENT DOCUMENTS

| 4,570,129 A | * | 2/1986 | Milberger | 330/277 |
| 5,880,631 A | * | 3/1999 | Sahota | 330/283 |
| 6,229,395 B1 | * | 5/2001 | Kay | 330/252 |
| 6,570,446 B1 | * | 5/2003 | Ling | 330/252 |
| 6,717,463 B2 | * | 4/2004 | Aparin et al. | 330/149 |
| 6,744,320 B2 | * | 6/2004 | Nguyen et al. | 330/253 |

* cited by examiner

*Primary Examiner*—Quochien B Vuong
(74) *Attorney, Agent, or Firm*—Garlick Harrison & Markison; James A. Harrison

(57) ABSTRACT

A multi-stage amplifier includes first and second amplification stages and a loading stage, all of which generate flicker noise. A degeneration block is operably disposed between circuit common and the loading stage wherein the degeneration block is operable to reduce flicker noise generated by at least one of the loading stage, the first amplification stage and the second amplification stage. The degeneration block further includes at least one active MOSFET operably biased in a linear region to provide a specified resistive value and coupled to receive and conduct the common mode portion of the intermediate stage output signal based upon a gate terminal bias signal. A degeneration block amplifier is operable to generate a replica device bias signal wherein the replica device is operable to set the gate terminal bias signal for the at least one active MOSFET based upon the replica device bias signal.

25 Claims, 8 Drawing Sheets differential Miller amplifier 200

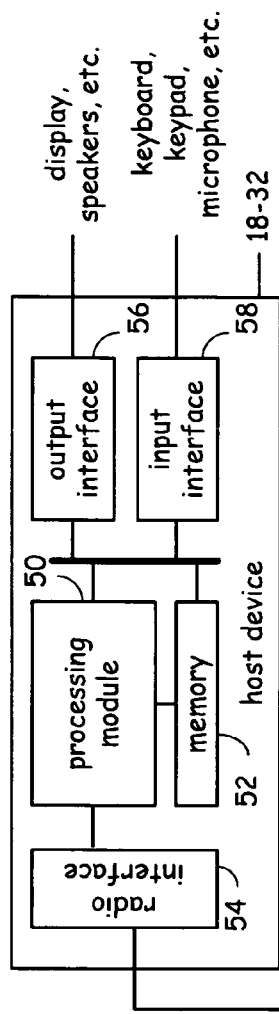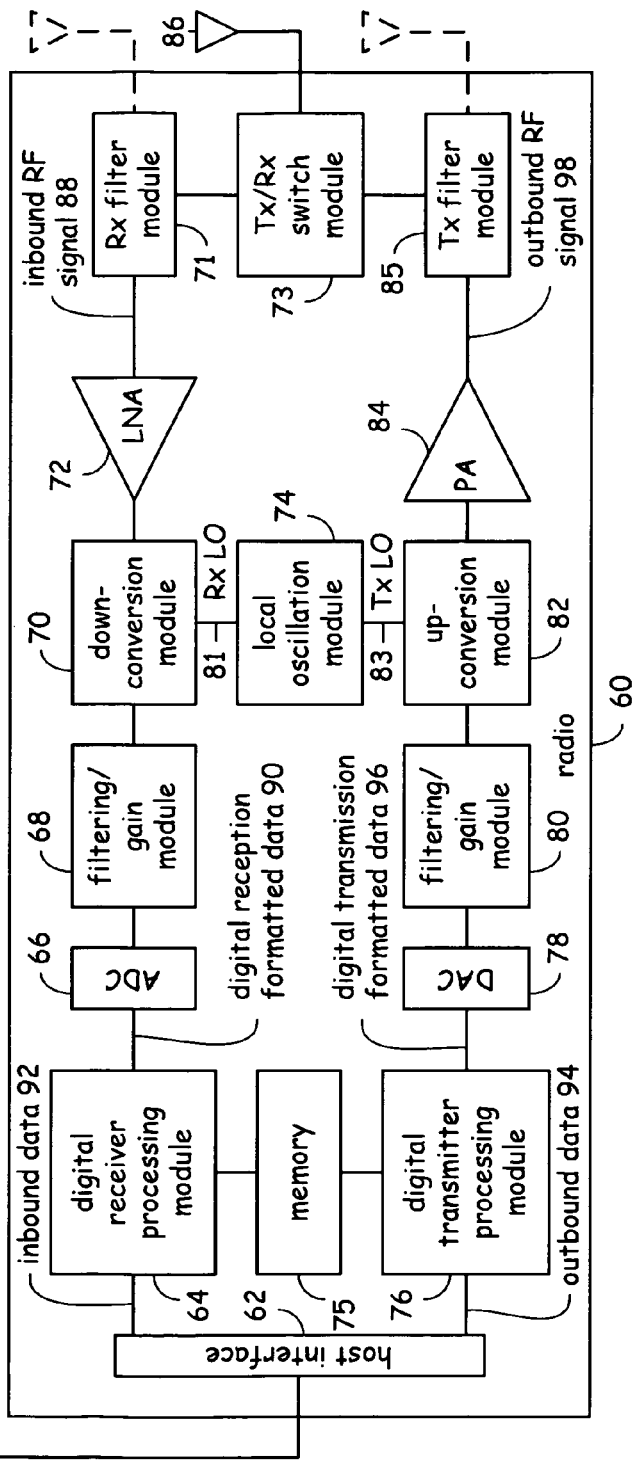
FIG. 2

FIG. 4 _differential Miller amplifier 150_

FIG. 5   differential Miller amplifier 200

FIG. 6 differential Miller amplifier 250 differential Miller amplifier 300

REDUCING FLICKER NOISE IN TWO-STAGE AMPLIFIERS

CROSS-REFERENCE TO RELATED APPLICATION

This application claims priority to and incorporates by reference U.S. Provisional Application entitled, "Reducing Flicker Noise in Two-Stage Amplifiers", having a Ser. No. 60/722,490 and a filing date of Sep. 30, 2005.

BACKGROUND

1. Technical Field

The present invention relates to wireless communications and, more particularly, to amplification circuitry within an integrated circuit device.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards, including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel or channels (e.g., one of a plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via a public switched telephone network (PSTN), via the Internet, and/or via some other wide area network.

Each wireless communication device includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier stage. The data modulation stage converts raw data into baseband signals in accordance with the particular wireless communication standard. The one or more intermediate frequency stages mix the baseband signals with one or more local oscillations to produce RF signals. The power amplifier stage amplifies the RF signals prior to transmission via an antenna.

Typically, the data modulation stage is implemented on a baseband processor chip, while the intermediate frequency (IF) stages and power amplifier stage are implemented on a separate radio processor chip. Historically, radio integrated circuits have been designed using bipolar circuitry, allowing for large signal swings and linear transmitter component behavior. Therefore, many legacy baseband processors employ analog interfaces that communicate analog signals to and from the radio processor.

Within the integrated circuits, many amplifier designs are often implemented to amplify a specific signal for subsequent processing. In current designs that implement MOSFET technology for noise sensitive applications, flicker noise caused by switching of n-channel and p-channel MOSFETs is desirably reduced. Methods for reducing the impact of device generated flicker noise include increasing device dimensions by increasing at least one of the channel width or channel length or by adding degeneration resistors. Increasing device size is undesirable because it goes against trends to reduce device sizes. Adding degeneration resistors can be undesirable because of performance variations due to temperature and process. It is desirable, therefore, to reduce flicker noise in a manner that overcomes these shortcomings.

SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE DRAWINGS

A better understanding of the present invention can be obtained when the following detailed description of the preferred embodiment is considered with the following drawings, in which:

FIG. 2 is a schematic block diagram illustrating a wireless communication host device and an associated radio;

DETAILED DESCRIPTION OF THE DRAWINGS

Figure 1:
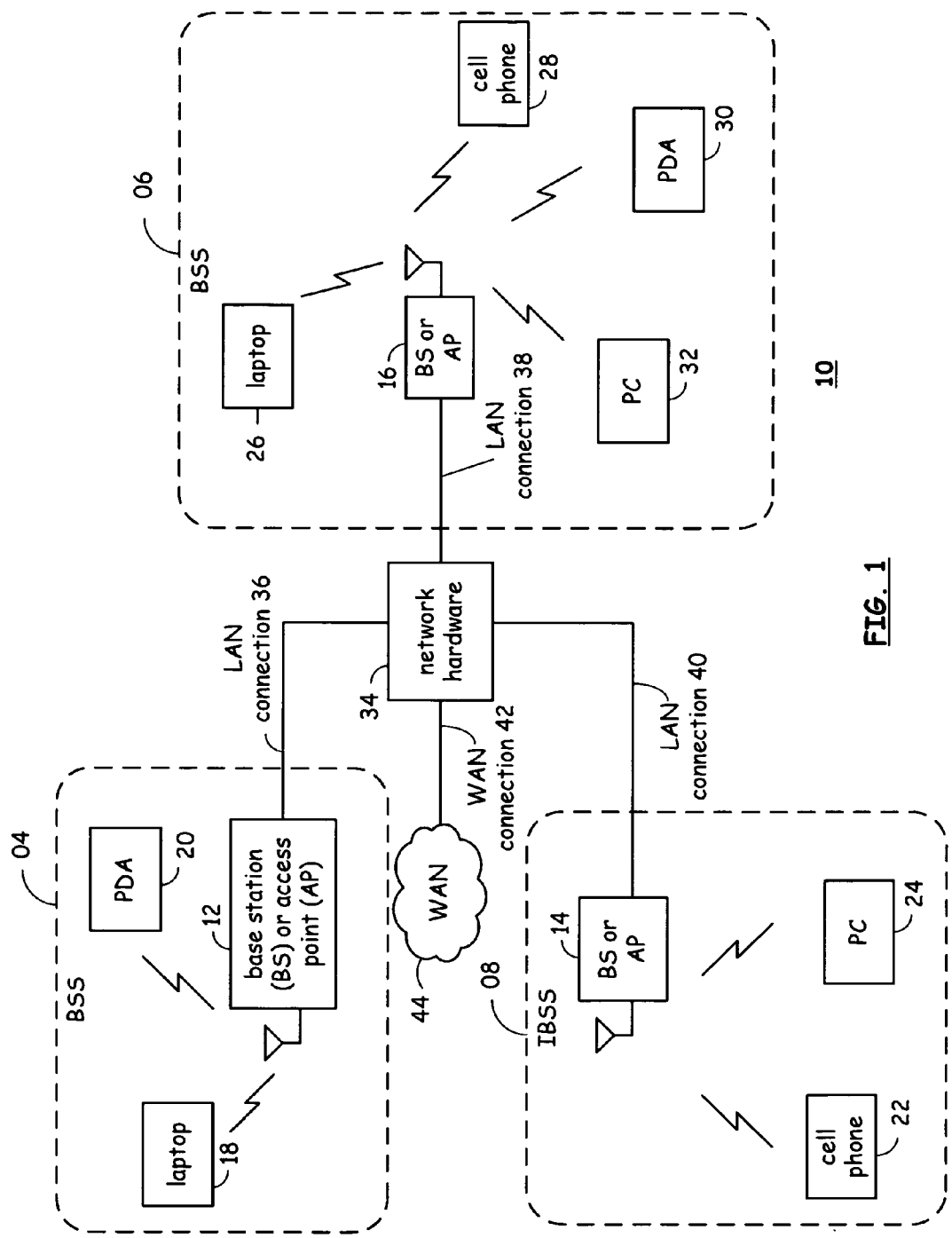
FIG. 1 is a functional block diagram illustrating a communication system that includes circuit devices and network elements and operation thereof according to one embodiment of the invention.

FIG. 1 is a functional block diagram illustrating a communication system that includes circuit devices and network elements and operation thereof according to one embodiment of the invention. More specifically, a plurality of network service areas 04, 06 and 08 are a part of a network 10. Network 10 includes a plurality of base stations or access points (APs) 12-16, a plurality of wireless communication devices 18-32 and a network hardware component 34. The wireless communication devices 18-32 may be laptop computers 18 and 26, personal digital assistants 20 and 30, personal computers 24 and 32 and/or cellular telephones 22 and 28. The details of aspects of the wireless communication devices will be described in greater detail with reference to FIGS. 4-9.

The base stations or APs 12-16 are operably coupled to the network hardware component 34 via local area network (LAN) connections 36, 38 and 40. The network hardware component 34, which may be a router, switch, bridge, modem, system controller, etc., provides a wide area network (WAN) connection 42 for the communication system 10 to an external network element such as WAN 44. Each of the base stations or access points 12-16 has an associated antenna or antenna array to communicate with the wireless communication devices in its area. Typically, the wireless communication devices 18-32 register with the particular base station or access points 12-16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio.

FIG. 2 is a schematic block diagram illustrating a wireless communication host device 18-32 and an associated radio 60. For cellular telephone hosts, radio 60 is a built-in component. For personal digital assistants hosts, laptop hosts, and/or personal computer hosts, the radio 60 may be built-in or an externally coupled component.

As illustrated, wireless communication host device 18-32 includes a processing module 50, a memory 52, a radio interface 54, an input interface 58 and an output interface 56. Processing module 50 and memory 52 execute the corresponding instructions that are typically done by the host device. For example, for a cellular telephone host device, processing module 50 performs the corresponding communication functions in accordance with a particular cellular telephone standard.

Radio interface 54 allows data to be received from and sent to radio 60. For data received from radio 60 (e.g., inbound data), radio interface 54 provides the data to processing module 50 for further processing and/or routing to output interface 56. Output interface 56 provides connectivity to an output device such as a display, monitor, speakers, etc., such that the received data may be displayed. Radio interface 54 also provides data from processing module 50 to radio 60. Processing module 50 may receive the outbound data from an input device such as a keyboard, keypad, microphone, etc., via input interface 58 or generate the data itself. For data received via input interface 58, processing module 50 may perform a corresponding host function on the data and/or route it to radio 60 via radio interface 54.

Radio 60 includes a host interface 62, a digital receiver processing module 64, an analog-to-digital converter 66, a filtering/gain module 68, a down-conversion module 70, a low noise amplifier 72, a receiver filter module 71, a transmitter/receiver (Tx/Rx) switch module 73, a local oscillation module 74, a memory 75, a digital transmitter processing module 76, a digital-to-analog converter 78, a filtering/gain module 80, an up-conversion module 82, a power amplifier 84, a transmitter filter module 85, and an antenna 86 operatively coupled as shown. The antenna 86 is shared by the transmit and receive paths as regulated by the Tx/Rx switch module 73. The antenna implementation will depend on the particular standard to which the wireless communication device is compliant.

Digital receiver processing module 64 and digital transmitter processing module 76, in combination with operational instructions stored in memory 75, execute digital receiver functions and digital transmitter functions, respectively. The digital receiver functions include, but are not limited to, demodulation, constellation demapping, decoding, and/or descrambling. The digital transmitter functions include, but are not limited to, scrambling, encoding, constellation mapping, and modulation. Digital receiver and transmitter processing modules 64 and 76, respectively, may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions.

Memory 75 may be a single memory device or a plurality of memory devices. Such a memory device may be a read-only memory, random access memory, volatile memory, non-volatile memory, static memory, dynamic memory, flash memory, and/or any device that stores digital information. Note that when digital receiver processing module 64 and/or digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. Memory 75 stores, and digital receiver processing module 64 and/or digital transmitter processing module 76 executes, operational instructions corresponding to at least some of the functions illustrated herein.

In operation, radio 60 receives outbound data 94 from wireless communication host device 18-32 via host interface 62. Host interface 62 routes outbound data 94 to digital transmitter processing module 76, which processes outbound data 94 in accordance with a particular wireless communication standard or protocol (e.g., IEEE 802.11(a), IEEE 802.11b, Bluetooth, etc.) to produce digital transmission formatted data 96. Digital transmission formatted data 96 will be a digital baseband signal or a digital low IF signal, where the low IF typically will be in the frequency range of one hundred kilohertz to a few megahertz.

Digital-to-analog converter 78 converts digital transmission formatted data 96 from the digital domain to the analog domain. Filtering/gain module 80 filters and/or adjusts the gain of the analog baseband signal prior to providing it to up-conversion module 82. Up-conversion module 82 directly converts the analog baseband signal, or low IF signal, into an RF signal based on a transmitter local oscillation 83 provided by local oscillation module 74. Power amplifier 84 amplifies the RF signal to produce an outbound RF signal 98, which is filtered by transmitter filter module 85. The antenna 86 transmits outbound RF signal 98 to a targeted device such as a base station, an access point and/or another wireless communication device.

Radio 60 also receives an inbound RF signal 88 via antenna 86, which was transmitted by a base station, an access point, or another wireless communication device. The antenna 86 provides inbound RF signal 88 to receiver filter module 71 via Tx/Rx switch module 73, where Rx filter module 71 bandpass filters inbound RF signal 88. The Rx filter module 71 provides the filtered RF signal to low noise amplifier 72, which amplifies inbound RF signal 88 to produce an amplified inbound RF signal. Low noise amplifier 72 provides the amplified inbound RF signal to down-conversion module 70, which directly converts the amplified inbound RF signal into an inbound low IF signal or baseband signal based on a receiver local oscillation 81 provided by local oscillation module 74. Down-conversion module 70 provides the inbound low IF signal or baseband signal to filtering/gain module 68. Filtering/gain module 68 may be implemented in accordance with the teachings of the present invention to filter and/or attenuate the inbound low IF signal or the inbound baseband signal to produce a filtered inbound signal.

Analog-to-digital converter 66 converts the filtered inbound signal from the analog domain to the digital domain to produce digital reception formatted data 90. Digital receiver processing module 64 decodes, descrambles, demaps, and/or demodulates digital reception formatted data 90 to recapture inbound data 92 in accordance with the particular wireless communication standard being implemented by radio 60. Host interface 62 provides the recaptured inbound data 92 to the wireless communication host device 18-32 via radio interface 54.

As one of average skill in the art will appreciate, the wireless communication device of FIG. 2 may be implemented using one or more integrated circuits. For example, the host device may be implemented on a first integrated circuit, while digital receiver processing module 64, digital transmitter processing module 76 and memory 75 may be implemented on a second integrated circuit, and the remaining components of radio 60, less antenna 86, may be implemented on a third integrated circuit. As an alternate example, radio 60 may be implemented on a single integrated circuit. As yet another example, processing module 50 of the host device and digital receiver processing module 64 and digital transmitter processing module 76 may be a common processing device implemented on a single integrated circuit.

Memory 52 and memory 75 may be implemented on a single integrated circuit and/or on the same integrated circuit as the common processing modules of processing module 50, digital receiver processing module 64, and digital transmitter processing module 76. As will be described, it is important that accurate oscillation signals are provided to mixers and conversion modules. A source of oscillation error is noise coupled into oscillation circuitry through integrated circuitry biasing circuitry. One embodiment of the present invention reduces the noise by providing a selectable pole low pass filter in current mirror devices formed within the one or more integrated circuits.

Local oscillation module 74 includes circuitry for adjusting an output frequency of a local oscillation signal provided therefrom. Local oscillation module 74 receives a frequency correction input that it uses to adjust an output local oscillation signal to produce a frequency corrected local oscillation signal output. While local oscillation module 74, up-conversion module 82 and down-conversion module 70 are implemented to perform direct conversion between baseband and RF, it is understood that the principles herein may also be applied readily to systems that implement an intermediate frequency conversion step at a low intermediate frequency.

Figure 3:
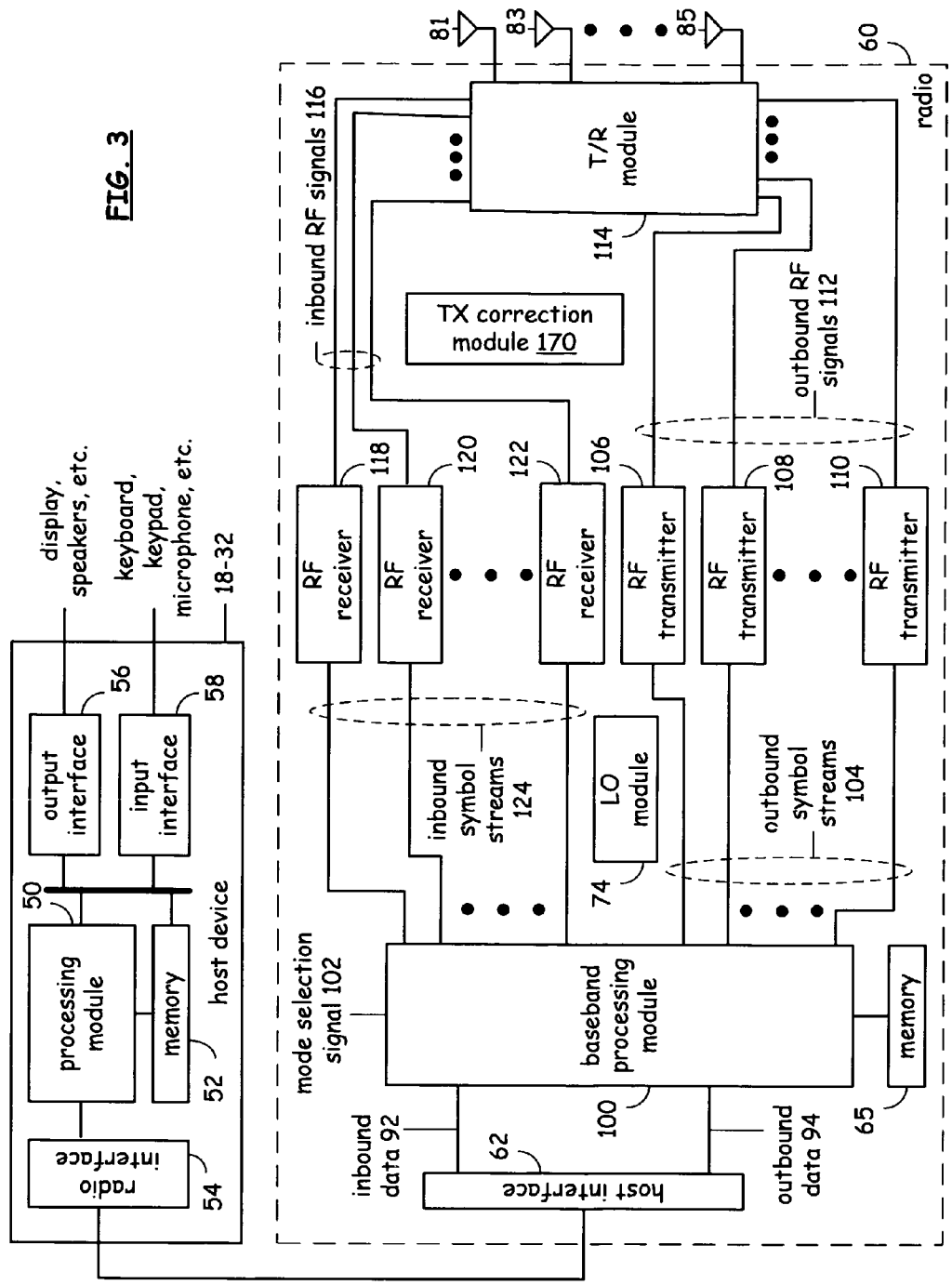
FIG. 3 is a schematic block diagram illustrating a wireless communication device that includes the host device and an associated radio.

FIG. 3 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, etc., such that the received data may be displayed. The radio interface 54 also provides data from the processing module 50 to the radio 60. The processing module 50 may receive the outbound data from an input device such as a keyboard, keypad, microphone, etc., via the input interface 58 or generate the data itself. For data received via the input interface 58, the processing module 50 may perform a corresponding host function on the data and/or route it to the radio 60 via the radio interface 54.

Radio 60 includes a host interface 62, a baseband processing module 100, memory 65, a plurality of radio frequency (RF) transmitters 106-110, a transmit/receive (T/R) module 114, a plurality of antennas 81-85, a plurality of RF receivers 118-120, and a local oscillation module 74. The baseband processing module 100, in combination with operational instructions stored in memory 65, executes digital receiver functions and digital transmitter functions, respectively. The digital receiver functions include, but are not limited to, digital intermediate frequency to baseband conversion, demodulation, constellation demapping, decoding, de-interleaving, fast Fourier transform, cyclic prefix removal, space and time decoding, and/or descrambling. The digital transmitter functions include, but are not limited to, scrambling, encoding, interleaving, constellation mapping, modulation, inverse fast Fourier transform, cyclic prefix addition, space and time encoding, and digital baseband to IF conversion. The baseband processing module 100 may be implemented using one or more processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 65 may be a single memory device or a plurality of memory devices. Such a memory device may be a read-only memory, random access memory, volatile memory, non-volatile memory, static memory, dynamic memory, flash memory, and/or any device that stores digital information. Note that when the baseband processing module 100 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The baseband processing module 100 receives the outbound data 94 and, based on a mode selection signal 102, produces one or more outbound symbol streams 104. The mode selection signal 102 will indicate a particular mode of operation that is compliant with one or more specific modes of the various IEEE 802.11 standards. For example, the mode selection signal 102 may indicate a frequency band of 2.4 GHz, a channel bandwidth of 20 or 22 MHz and a maximum bit rate of 54 megabits-per-second. In this general category, the mode selection signal will further indicate a particular rate ranging from 1 megabit-per-second to 54 megabits-per-second. In addition, the mode selection signal will indicate a particular type of modulation, which includes, but is not limited to, Barker Code Modulation, BPSK, QPSK, CCK, 16 QAM and/or 64 QAM. The mode selection signal 102 may also include a code rate, a number of coded bits per subcarrier (NBPSC), coded bits per OFDM symbol (NCBPS), and/or data bits per OFDM symbol (NDBPS). The mode selection signal 102 may also indicate a particular channelization for the corresponding mode that provides a channel number and corresponding center frequency. The mode selection signal 102 may further indicate a power spectral density mask value and a number of antennas to be initially used for a MIMO communication.

The baseband processing module 100, based on the mode selection signal 102 produces one or more outbound symbol streams 104 from the outbound data 94. For example, if the mode selection signal 102 indicates that a single transmit antenna is being utilized for the particular mode that has been selected, the baseband processing module 100 will produce a single outbound symbol stream 104. Alternatively, if the mode selection signal 102 indicates 2, 3 or 4 antennas, the baseband processing module 100 will produce 2, 3 or 4 outbound symbol streams 104 from the outbound data 94.

Depending on the number of outbound symbol streams 104 produced by the baseband processing module 100, a corresponding number of the RF transmitters 106-110 will be enabled to convert the outbound symbol streams 104 into outbound RF signals 112. In general, each of the RF transmitters 106-110 includes a digital filter and upsampling module, a digital-to-analog conversion module, an analog filter module, a frequency up conversion module, a power amplifier, and a radio frequency bandpass filter. The RF transmitters 106-110 provide the outbound RF signals 112 to the transmit/receive module 114, which provides each outbound RF signal to a corresponding antenna 81-85.

When the radio 60 is in the receive mode, the transmit/receive module 114 receives one or more inbound RF signals 116 via the antennas 81-85 and provides them to one or more RF receivers 118-122. The RF receiver 118-122 converts the inbound RF signals 116 into a corresponding number of inbound symbol streams 124. The number of inbound symbol streams 124 will correspond to the particular mode in which the data was received. The baseband processing module 100 converts the inbound symbol streams 124 into inbound data 92, which is provided to the host device 18-32 via the host interface 62.

As one of average skill in the art will appreciate, the wireless communication device of FIG. 3 may be implemented using one or more integrated circuits. For example, the host device may be implemented on a first integrated circuit, the baseband processing module 100 and memory 65 may be implemented on a second integrated circuit, and the remaining components of the radio 60, less the antennas 81-85, may be implemented on a third integrated circuit. As an alternate example, the radio 60 may be implemented on a single integrated circuit. As yet another example, the processing module 50 of the host device and the baseband processing module 100 may be a common processing device implemented on a single integrated circuit. Further, the memory 52 and memory 65 may be implemented on a single integrated circuit and/or on the same integrated circuit as the common processing modules of processing module 50 and the baseband processing module 100.

Figure 4:
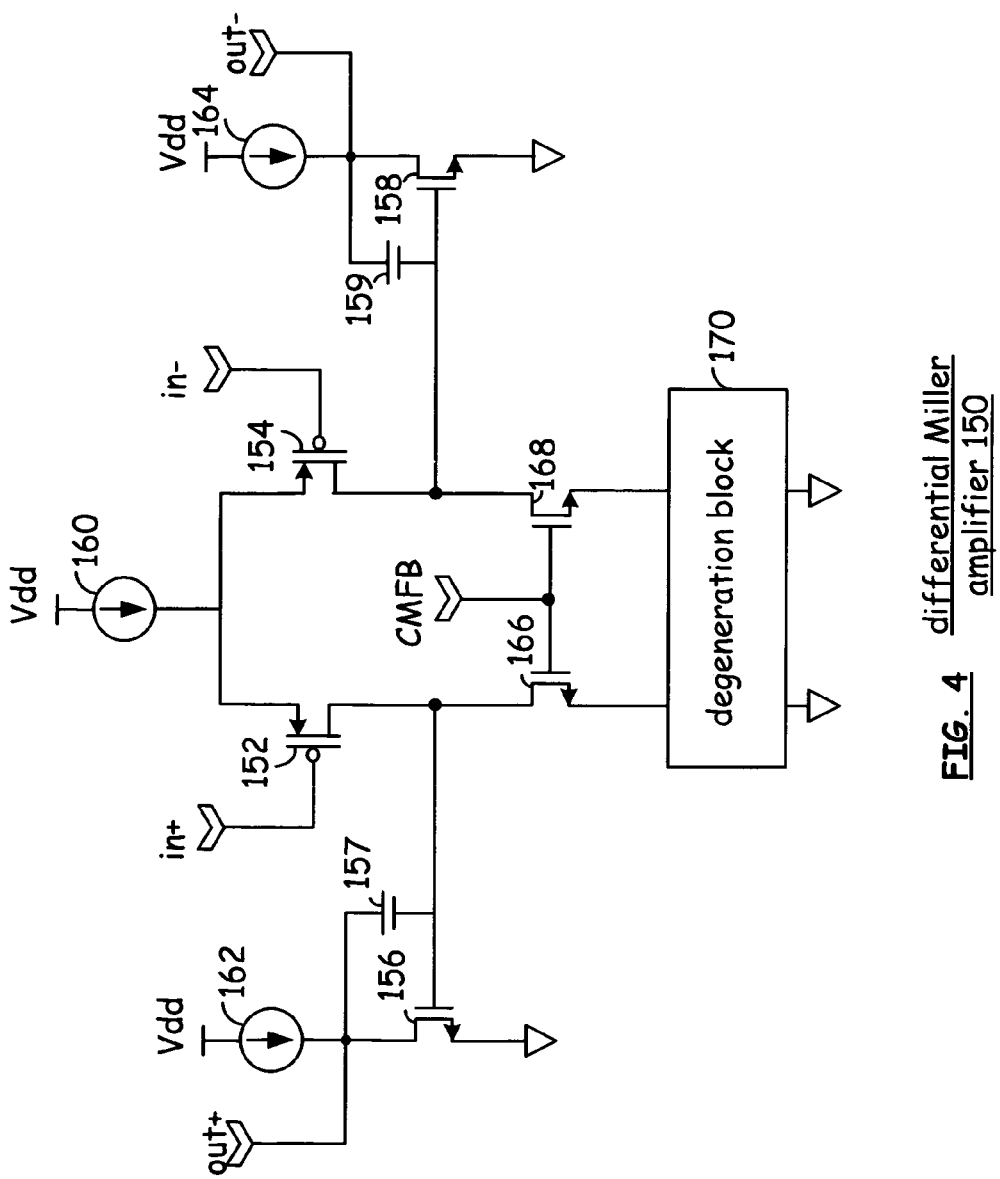
FIG. 4 is a functional schematic diagram of a multi-stage differential amplifier formed according to one embodiment of the invention.

FIG. 4 is a functional schematic diagram of a multi-stage differential amplifier formed according to one embodiment of the invention. The circuit of FIG. 4 may readily be formed as a part of an integrated circuit device including, but not limited to, integrated circuit radio transceivers, as shown in FIGS. 2 and 3. For example, the amplifier of FIG. 4 may be formed within filtering/gain modules 68 or 80 of FIG. 2 or within any one of the receivers 118-122 or transmitters 106-110 of FIG. 3. Generally, however, the amplifier of FIG. 4 (as well as FIGS. 5 and 6, as will be discussed in the following pages) may be used in any integrated circuit technology application. Thus, the integrated circuit comprises logic circuitry for performing a specified function (for example, the circuitry of FIGS. 2 and 3 not including the amplifier) and a multi-stage amplifier operably disposed to amplify continuous waveform signals for subsequent processing by the logic circuitry. In the described embodiment, the amplifier is a differential Miller amplifier 150 that includes a first amplification stage operably disposed to receive an input signal wherein the first amplification stage is operable to produce an intermediate stage output signal. The first amplification stage includes input MOSFETs 152 and 154. In the described embodiment, input MOSFETs 152 and 154 are inverting p-channel MOSFETs. The output of MOSFETs 152 and 154 (namely the drain terminals thereof) produces the intermediate stage output signal. A second amplification stage, that includes output MOSFETs 156 and 158, is operably disposed to receive the intermediate stage output signal and is operable to produce an amplified output signal at their drain terminals. A supply current source 160 provides a direct current to the source terminals of MOSFETs 152 and 154. Two Miller capacitors, namely capacitors 157 and 159, are operably disposed across the gate and drain terminals of output MOSFETs 156 and 158, respectively. Further, current sources 162 and 164 are operably disposed to supply a drain current to output MOSFETs 156 and 158, respectively. Source terminals of output MOSFETs 156 and 158 are coupled to circuit common. Miller capacitors 157 and 159 create a dominant pole at the gates of the output MOSFETs 156 and 158 having a capacitance value that is a function of the gain of the output stage and is roughly equal to the internal capacitance of the capacitor plus gain of the output stage, as may be appreciated by one of average skill in the art.

A loading stage also is operably disposed to receive the intermediate stage output signal and is operable to conduct a common mode portion of the intermediate stage output signal to a circuit common. Specifically, the loading stage includes load stage MOSFETs 166 and 168 having commonly connected gate terminals that are further operably disposed to receive a common mode feedback signal that operably biases the load devices to prompt the load devices to conduct a common mode signal produced by a supply current source towards circuit common. MOSFETs 166, 168, 156 and 158 are all n-channel MOSFETs in the described embodiment of the invention.

The source terminals of load stage MOSFETs 166 and 168 are operably coupled to a degeneration block 170 that is operably disposed between circuit common and the loading stage. The degeneration block 170 is operable to reduce flicker noise generated by at least one of the loading stage, the first amplification stage and the second amplification stage. In the described embodiment of the invention, degeneration block 170 includes at least one active MOSFET operably biased in a linear region to provide a specified resistive value and coupled to receive and conduct the common mode portion of the intermediate stage output signal based upon a gate terminal bias signal. By utilizing an active MOSFET biased in the linear region to operate as a resistive element, variations due to process and temperature may be compensated for to provide a substantially non-varying resistive value.

Figure 5:
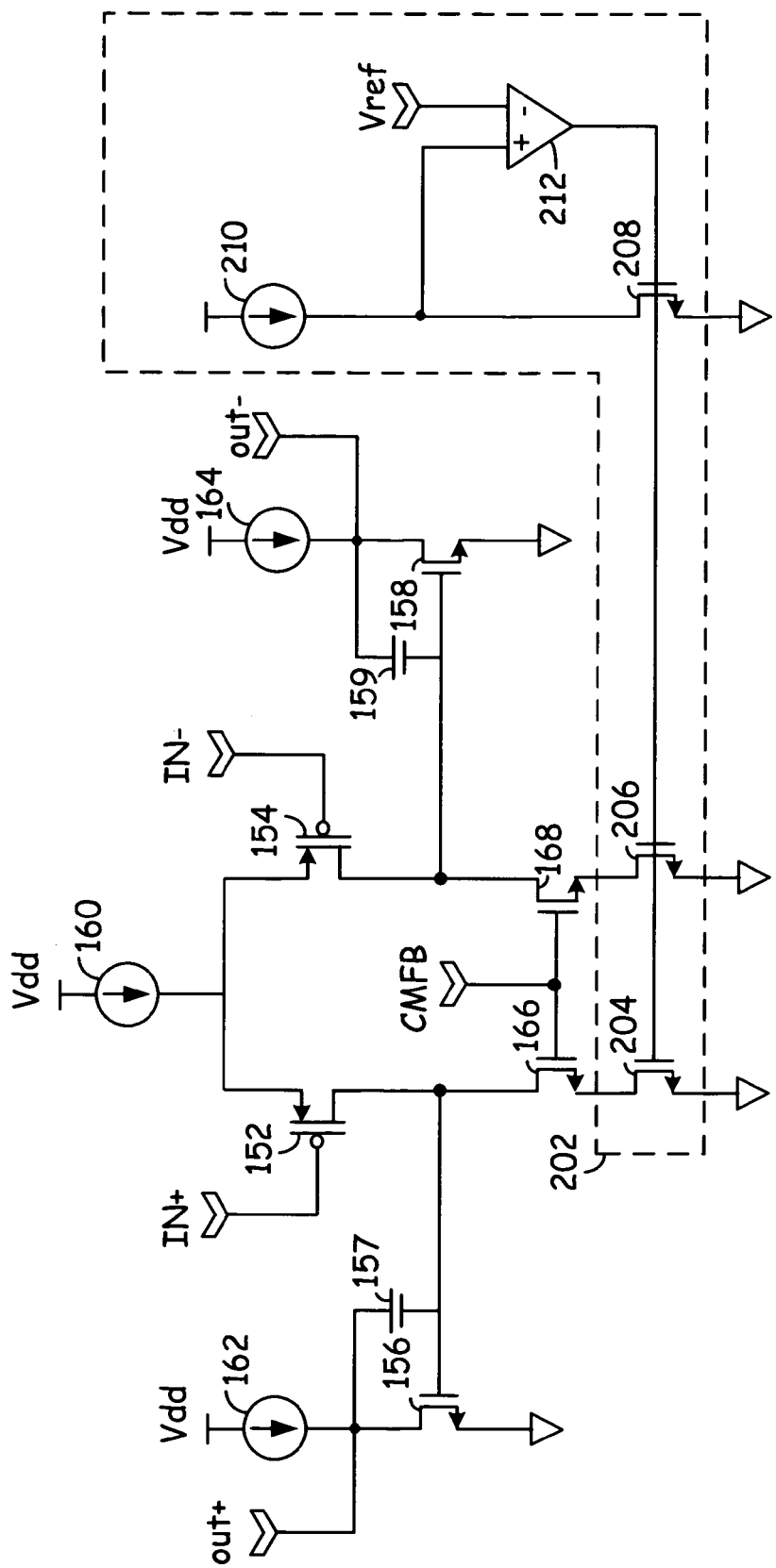
FIG. 5 is a functional schematic diagram of a multi-stage differential amplifier formed according to one embodiment of the invention.

FIG. 5 is a functional schematic diagram of a multi-stage differential amplifier formed according to one embodiment of the invention. Generally, with the exception of the degeneration block 202, the topology of FIG. 5 is similar to FIG. 4 and includes commonly numbered elements for common parts. As such, the discussion of FIG. 5 will be of the difference (namely, degeneration block 202).

Specifically, a differential Miller amplifier 200 includes the first and second amplification stages and the loading stage of FIG. 4. Degeneration block 202 is coupled to the loading stage, which comprises load stage MOSFETs 166 and 168. The at least one active device of degeneration block 202, in the described embodiment of FIG. 5, includes degeneration MOSFETs 204 and 206. Further, degeneration block 202 includes a replica device 208 that is operable to conduct a current produced by a first degeneration block current source 210 based upon a replica device bias signal produced by a degeneration block amplifier 212. Degeneration block amplifier 212 is operably disposed to receive a reference voltage at a first input and generates the replica device bias signal for the replica device 208 based upon a difference between the first input and a second input coupled to a node disposed between the first degeneration block current source 210 and the replica device 208. Replica device 208 is operable to set the gate terminal bias signal for the at least one active MOSFET based upon the replica device bias signal.

Generally, MOSFETs 204 and 206 receive a bias signal across the gate and source terminals, wherein the bias signal is based upon a bias voltage received by the replica device 208 which is generated by degeneration block amplifier 212. Degeneration block amplifier 212 generates the bias voltage based upon a difference between an output voltage of the replica device 208 and a reference voltage. In the described embodiment, the reference voltage is operably coupled to the negative input of degeneration block amplifier 212, which the output voltage (drain terminal voltage) of replica device 208 is operably coupled to the positive input of degeneration block amplifier 212. The bias level of replica device 208 is therefore a function of the difference between the reference voltage level and the replica device 208 output voltage wherein the reference voltage is subtracted from the replica device output voltage. Thus, in one embodiment, the reference voltage is adjusted to compensate for process/temperature variations to provide a specified or desired resistance magnitude by MOSFETs 204 and 206 which are biased to operate in the linear region.

Figure 6:
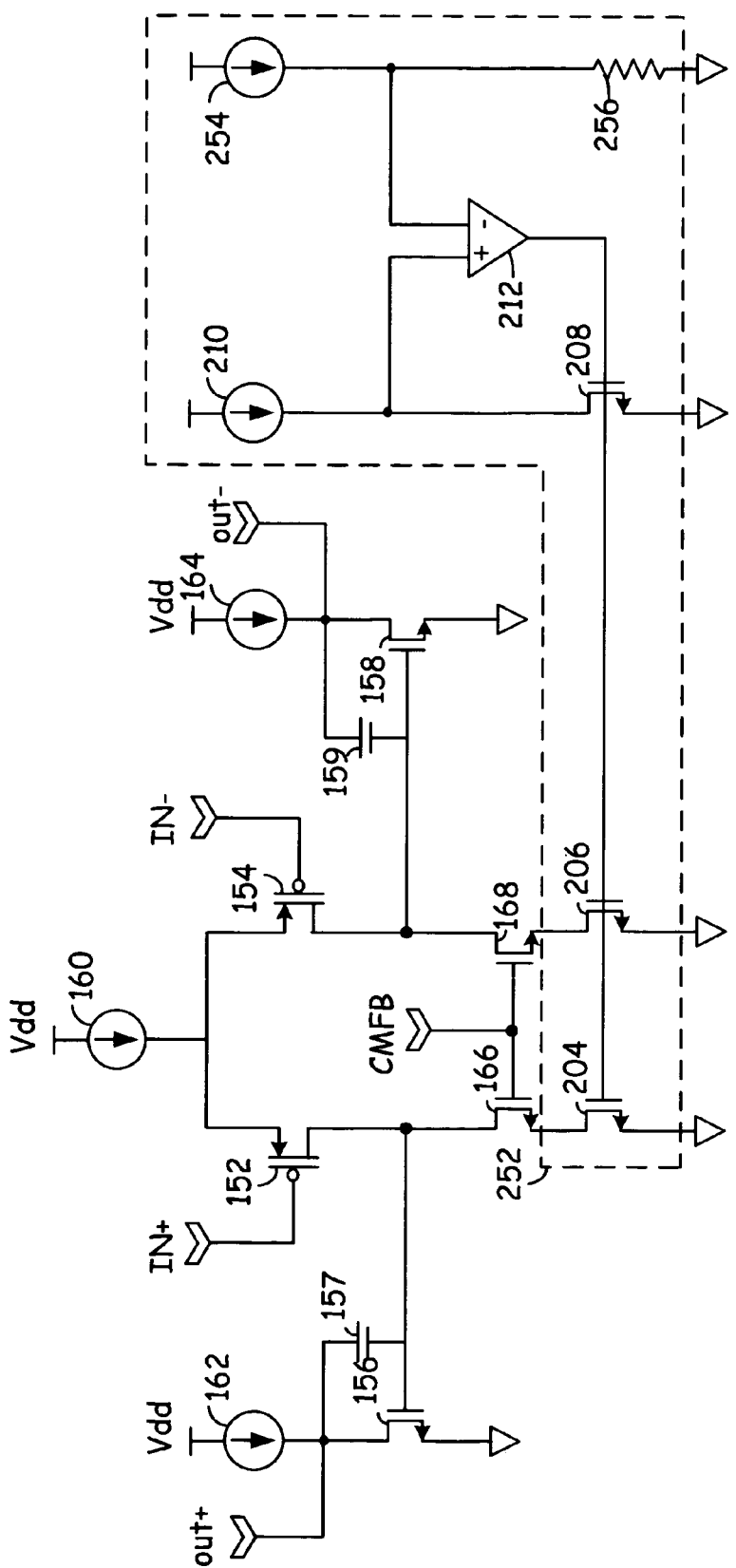
FIG. 6 is a functional schematic diagram of a multi-stage differential amplifier formed according to one embodiment of the invention.

FIG. 6 is a functional schematic diagram of a multi-stage differential amplifier 250 formed according to one embodiment of the invention. Generally, with the exception of the portions of a degeneration block 252, the topology of FIG. 6 is similar to FIG. 5 and includes commonly numbered elements for common parts. As such, the discussion of FIG. 6 will be of the difference (namely, the differing circuit components of degeneration block 252).

Generally, the topology of FIG. 6 is very similar to that of FIG. 5 except for a portion of degeneration block 252. Specifically, rather than providing a reference voltage to the negative input terminal of degeneration block amplifier 212, degeneration block 252 includes a second degeneration block current source 254 and a degeneration block biasing resistor 256 for conducting current provided by the second degeneration block current source 254. The negative input of degeneration block amplifier 212 is operably disposed to receive, at a first input, a voltage drop across the degeneration block biasing resistor 256. Thus, degeneration block amplifier 212 generates the bias signal for the replica device 208 based upon a difference between the first input and a second input coupled to a node disposed between the first degeneration block current source 210 and the replica device 208. Thus, in operation, current provided by the second degeneration block current source 254 may be adjusted to adjust the voltage drop across degeneration block biasing resistor 256 to adjust an amplified difference that is generated as the replica device 208 bias current.

Figure 7:
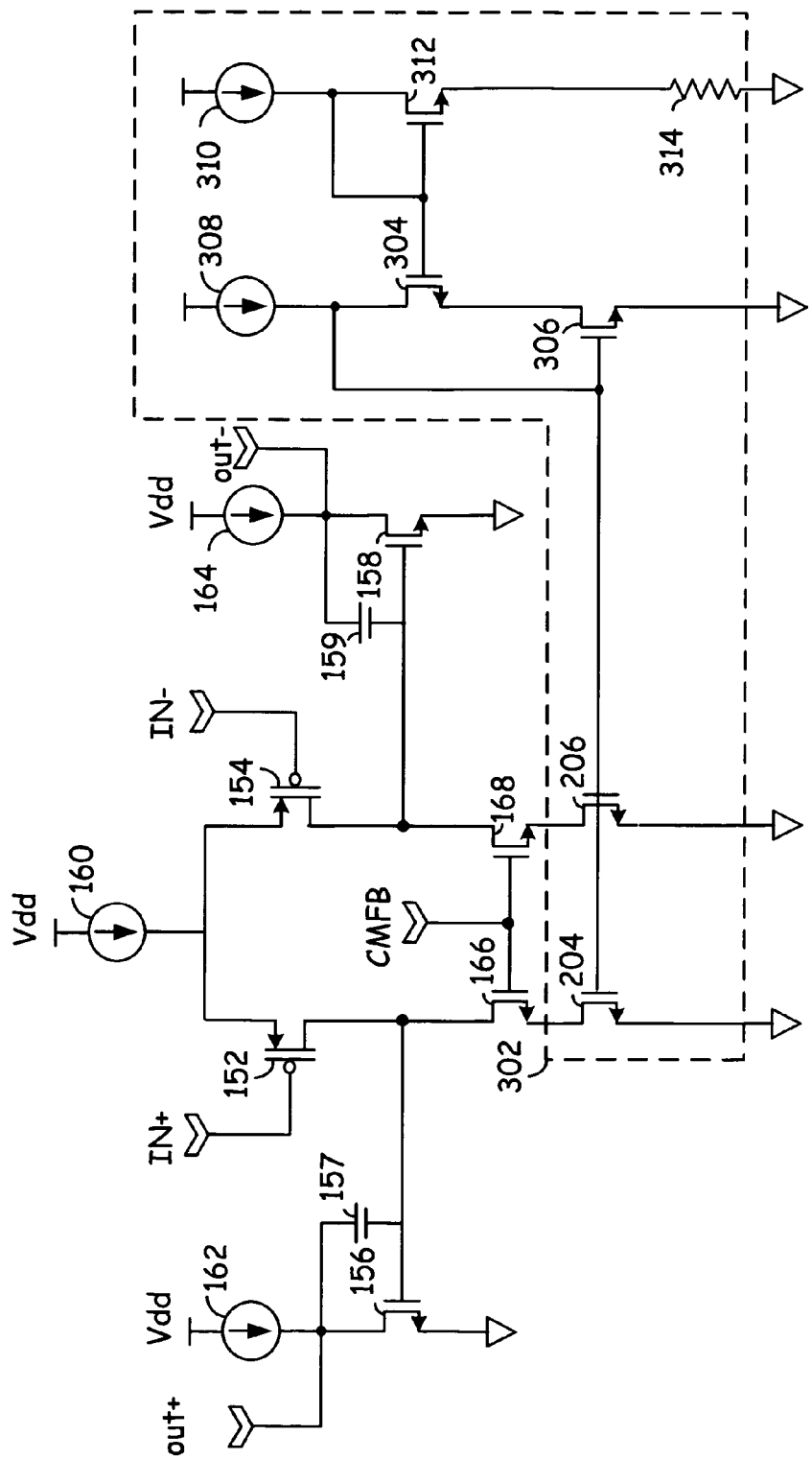
FIG. 7 is a functional schematic diagram of a multi-stage differential amplifier formed according to one embodiment of the invention.

FIG. 7 is a functional schematic diagram of a multi-stage differential amplifier 300 formed according to one embodiment of the invention. Generally, with the exception of the portions of degeneration block 302, the topology of FIG. 7 is similar to FIGS. 5 and 6 and includes commonly numbered elements for common parts. As such, the discussion of FIG. 7 will be of the difference (namely, the differing circuit components of degeneration block 302).

Generally, the topology of FIG. 7 is very similar to that of FIG. 6 except for a portion of degeneration block 302. Specifically, rather than merely specifying that the degeneration block 302 includes an operational amplifier (Op Amp) as a degeneration block amplifier as in the embodiment of FIG. 6, the circuit of FIG. 7 includes an amplification MOSFET 304 operably disposed to receive and conduct current generated for a replica device 306 based upon an amplification MOSFET bias signal. In the described embodiment, a first degeneration block current source 308 generates current conducted through the channels of amplification MOSFET 304 and replica device 306 to circuit common. Amplification MOSFET 304 receives a bias signal generated by a second degeneration block current source 310 that provides a current that is conducted through a level shifting MOSFET 312 and through a degeneration block biasing resistor 314. Degeneration block biasing resistor 314 is operable to conduct current provided by the second degeneration block current source 310 and conducted through level shifting MOSFET 312 that is operably disposed between the second degeneration block current source 310 and the degeneration block biasing resistor 314. The level shifting MOSFET 312 is operable to drop a voltage that is substantially equal to a voltage dropped by the amplification MOSFET 304.

In the described embodiment, the at least one active MOSFET (namely, MOSFETs 204 and 206) and the replica device 306 are scaled to be substantially similar. Further, the amplification MOSFET bias signal is received from an output terminal (specifically, the drain terminal) of the level shifting MOSFET 312. As such, the current level provided by second degeneration block current source 310 may be adjusted to adjust the amplification MOSFET bias signal, and therefore the replica device 306, to set the bias levels and effective resistance of MOSFETs 204 and 206 (the so called at least one active device) to compensate for temperature and process variations. Because MOSFET 312 is a level adjusting MOSFET, it is scaled to be substantially similar to amplification MOSFET 304. Both MOSFETs 304 and 312 are n-channel MOSFETs in the described embodiment of the invention.

In operation, a differential input signal is applied to the gate terminals of input MOSFETs 152 and 154. A direct current is provided by supply current source 160. Because MOSFETs 152 and 154 are inverting p-channel MOSFETs, they provide less noise for a specified amount of gain. For example, using inverting p-channel MOSFETs may result in one-fourth as much flicker noise being introduced by the input MOSFETs in comparison to n-channel input MOSFETs.

Output MOSFETs 156 and 158 receive an amplified output (the intermediate stage output signal) from the drain terminals of MOSFETs 152 and 154 at their gate terminals. The drain terminals of MOSFETs 156 and 158 are operably disposed to receive a direct current provided by current sources 162 and 164. The amount of this direct current that is conducted through the channels of MOSFETs 156 and 158 is largely based upon the magnitude of the intermediate stage output signal in conjunction with Miller capacitors 157 and 159, which are coupled across the gate and drain terminals of MOSFETs 156 and 158, respectively.

A common mode feedback loop signal is produced to the gate terminals of load stage MOSFETs 166 and 168 of a loading stage to prompt load stage MOSFETs 166 and 168 to conduct a common direct current level produced by supply current source 160 to circuit common. One of average skill in the art may readily implement a feedback loop to generate the common mode feedback signal used to bias load stage MOSFETs 166 and 168.

Each of the MOSFET devices 152, 154, 156, 158, 166 and 168 contributes flicker noise to the amplifier of any of the embodiments of the invention. Accordingly, to reduce flicker noise in a manner that avoids utilizing substantially larger MOSFET devices, resistor configured and biased MOSFETs are utilized in a manner that compensates for process and temperature variations. Accordingly, a predictable amount of degeneration may be applied to reduce flicker noise effects at the output of the amplifier in a manner that provides a constant and predictable amount of loading and gain reduction. As such, a predictable output gain level is provided while adequately reducing flicker noise.

Figure 8:
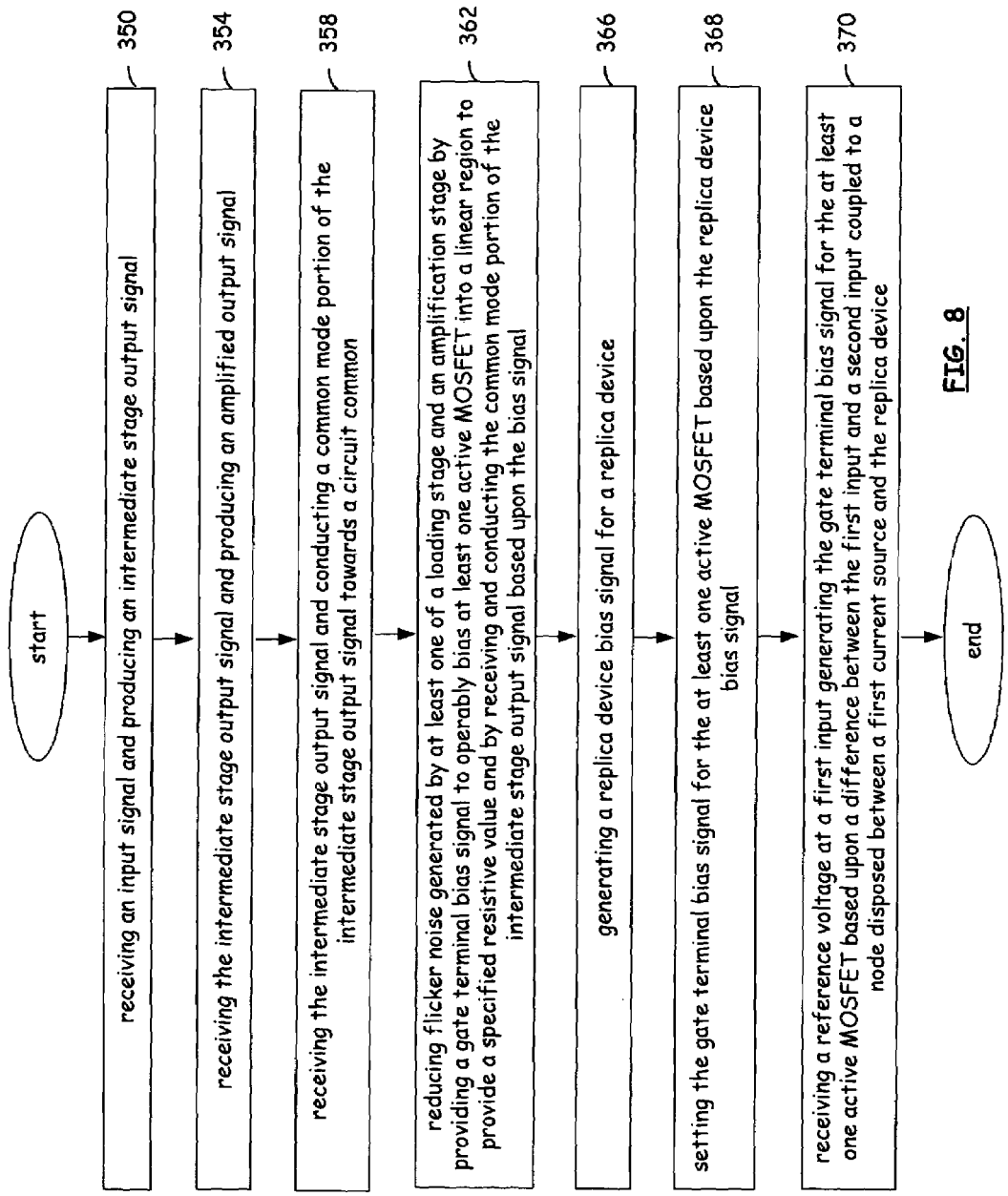
FIG. 8 is a flow chart illustrating a method according to one embodiment of the invention.

FIG. 8 is a flow chart illustrating a method according to one embodiment of the invention. Referring now to FIG. 8, the method includes initially receiving an input signal and producing an intermediate stage output signal (step 350). In some embodiments of the invention, this step includes inverting the input signal prior to amplifying the input signal to produce the intermediate stage output signal. In relation to the described structures, this step may be performed by the input stage of the amplifier. Subsequently, the method includes receiving the intermediate stage output signal and producing an amplified output signal (step 354). This step is performed, in one embodiment, in an output stage of an amplifier. The method also includes receiving the intermediate stage output signal and conducting a common mode portion of the intermediate stage output signal towards a circuit common in a loading stage based upon a common mode feedback signal (step 358). One aspect of the present invention includes receiving the common mode portion in a degeneration block and reducing flicker noise generated by at least one of a loading stage and an amplification stage by providing a gate terminal bias signal to operably bias at least one active MOSFET into a linear region to provide a specified resistive value and by receiving and conducting the common mode portion of the intermediate stage output signal based upon the gate terminal bias signal to circuit common (step 362).

As a part of reducing flicker noise in the degeneration block and conducting a portion of the common mode signal to ground, the method includes generating a replica device bias signal for a replica device to define a bias level for at least one active device of the degeneration block (step 366). Thus, the method further includes setting the gate terminal bias signal for the at least one active MOSFET based upon the replica device bias signal (step 368). The above described method steps further include providing a channel current for the replica device. Additionally, in a system utilizing an operational amplifier to generate a bias signal for the replica device, and therefore for the at least one active MOSFET of the degeneration block, the method for generating the replica device bias signal includes receiving a reference voltage at a first input generating the gate terminal bias signal for the at least one active MOSFET based upon a difference between the first input and a second input coupled to a node disposed between a current source and the replica device. In an alternate embodiment of the invention, the method for generating the replica device bias signal includes conducting current provided by a second current source into a degeneration block biasing resistor and using a voltage drop across the degeneration block biasing resistor as a reference signal. Generally, the method includes receiving and conducting the channel current for the replica device based upon an amplification MOSFET bias signal. To provide for a balanced operation, the method also includes, in one embodiment dropping, a voltage across a level shifting MOSFET that is substantially equal to a voltage dropped by the amplification MOSFET as a part of generating the replica device bias signal.

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled".

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

The invention claimed is:

1. An integrated circuit device, comprising:
logic circuitry for performing a specified function; and
a multi-stage amplifier operably disposed to amplify continuous waveform signals for subsequent processing by the logic circuitry, comprising:

a first amplification stage operably disposed to receive an input signal wherein the first amplification stage is operable to produce an intermediate stage output signal;

a second amplification stage operably disposed to receive the intermediate stage output signal, wherein the second amplification stage is operable to produce an amplified output signal;

a loading stage operably disposed to receive the intermediate stage output signal and operable to conduct a common mode portion of the intermediate stage output signal to a circuit common; and a degeneration block operably disposed between circuit common and the loading stage wherein the degeneration block is operable to reduce flicker noise generated by at least one of the loading stage, the first amplification stage and the second amplification stage, wherein the degeneration block further includes:

at least one active MOSFET operably biased in a linear region to provide a specified resistive value and coupled to receive and conduct the common mode portion of the intermediate stage output signal based upon a gate terminal bias signal;

a degeneration block amplifier for generating a replica device bias signal; and a replica device operable to set the gate terminal bias signal for the at least one active MOSFET based upon the replica device bias signal.

2. The integrated circuit device of claim 1 wherein the degeneration block further includes a first degeneration block current source operably disposed to provide a channel current for the replica device.

3. The integrated circuit device of claim 1 wherein the degeneration block amplifier is operably disposed to receive a reference voltage at a first input and further wherein the degeneration block amplifier generates the gate terminal bias signal for the at least one active MOSFET based upon a difference between the first input and a second input coupled to a node disposed between the first degeneration block current source and the replica device.

4. The integrated circuit device of claim 3 wherein the degeneration block amplifier further includes an amplification MOSFET operably disposed to receive and conduct the channel current for the replica device and based upon an amplification MOSFET bias signal.

5. The integrated circuit device of claim 4 further including a second degeneration block current source, a degeneration block biasing resistor for conducting current provided by the second degeneration block current source and further including a level shifting MOSFET operably disposed between the second degeneration block current source and the degeneration block biasing resistor, the level shifting MOSFET being operable to drop a voltage that is substantially equal to a voltage dropped by the amplification MOSFET bias signal.

6. The integrated circuit device of claim 5 wherein the at least one active MOSFET and the replica device are scaled to be substantially similar.

7. The integrated circuit device of claim 5 wherein the amplification MOSFET bias signal is received from an output terminal of the level shifting MOSFET.

8. The integrated circuit device of claim 1 wherein the degeneration block further includes a second degeneration block current source and a degeneration block biasing resistor for conducting current provided by the second degeneration block current source.

9. The integrated circuit device of claim 8 wherein the degeneration block amplifier is operably disposed to receive a voltage drop across the degeneration block biasing resistor at a first input and further wherein the degeneration block amplifier generates the replica device bias signal for the replica device based upon a difference between the first input and a second input coupled to a node disposed between the first degeneration block current source and the replica device.

10. A multi-stage amplifier, comprising:

a first amplification stage operably disposed to receive an input signal wherein the first amplification stage is operable to produce an intermediate stage output signal;

a second amplification stage operably disposed to receive the intermediate stage output signal, wherein the second amplification stage is operable to produce an amplified output signal;

a loading stage operably disposed to receive the intermediate stage output signal and operable to conduct a common mode portion of the intermediate stage output signal to a circuit common; and a degeneration block operably disposed between circuit common and the loading stage wherein the degeneration block is operable to reduce flicker noise generated by at least one of the loading stage, the first amplification stage and the second amplification stage, wherein the degeneration block further includes:

at least one active MOSFET operably biased in a linear region to provide a specified resistive value and coupled to receive and conduct the common mode portion of the intermediate stage output signal based upon a gate terminal bias signal;

a degeneration block amplifier for generating a replica device bias signal; and a replica device operable to set the gate terminal bias signal for the at least one active MOSFET based upon the replica device bias signal.

11. The multi-stage amplifier of claim 10 wherein the degeneration block further includes a first degeneration block current source operably disposed to provide a channel current for the replica device.

12. The multi-stage amplifier of claim 10 wherein the degeneration block amplifier is operably disposed to receive a reference voltage at a first input and further wherein the degeneration block amplifier generates the gate terminal bias signal for the at least one active MOSFET based upon a difference between the first input and a second input coupled to a node disposed between the first degeneration block current source and the replica device.

13. The multi-stage amplifier of claim 12 wherein the degeneration block amplifier further includes an amplification MOSFET operably disposed to receive and conduct the channel current for the replica device and based upon an amplification MOSFET bias signal.

14. The multi-stage amplifier of claim 13 further including a second degeneration block current source, a degeneration block biasing resistor for conducting current provided by the second degeneration block current source and further including a level shifting MOSFET operably disposed between the second degeneration block current source and the degeneration block biasing resistor, the level shifting MOSFET being operable to drop a voltage that is substantially equal to a voltage dropped by the amplification MOSFET bias signal.

15. The multi-stage amplifier of claim 14 wherein the at least one active MOSFET and the replica device are scaled to be substantially similar.

16. The multi-stage amplifier of claim 14 wherein the amplification MOSFET bias signal is received from an output terminal of the level shifting MOSFET.

17. The multi-stage amplifier of claim 10 wherein the degeneration block further includes a second degeneration block current source and a degeneration block biasing resistor for conducting current provided by the second degeneration block current source.

18. The multi-stage amplifier of claim 17 wherein the degeneration block amplifier is operably disposed to receive a voltage drop across the degeneration block biasing resistor at a first input and further wherein the degeneration block amplifier generates the replica device bias signal for the replica device based upon a difference between the first input and a second input coupled to a node disposed between the first degeneration block current source and the replica device.

19. A method in a multi-stage amplifier, comprising:
- receiving an input signal and producing an intermediate stage output signal;
- receiving the intermediate stage output signal and producing an amplified output signal;
- receiving the intermediate stage output signal and conducting a common mode portion of the intermediate stage output signal to a circuit common;
- reducing flicker noise generated by at least one of a loading stage and an amplification stage by providing a gate terminal bias signal to operably bias at least one active MOSFET into a linear region to provide a specified resistive value and by receiving and conducting the common mode portion of the intermediate stage output signal based upon the gate terminal bias signal;
- generating a replica device bias signal for a replica device; and
- setting the gate terminal bias signal for the at least one active MOSFET based upon the replica device bias signal.

20. The method of claim 19 further including providing a channel current for the replica device.

21. The method of claim 19 further including receiving a reference voltage at a first input generating the gate terminal bias signal for the at least one active MOSFET based upon a difference between the first input and a second input coupled to a node disposed between a first current source and the replica device.

22. The method of claim 21 further including receiving and conducting the channel current for the replica device and based upon an amplification MOSFET bias signal.

23. The method of claim 22 further including dropping a voltage across a level shifting MOSFET that is substantially equal to a voltage dropped by the amplification MOSFET bias signal.

24. The method of claim 19 wherein the multi-stage amplifier further including conducting current provided by a second current source into a degeneration block biasing resistor.

25. The method of claim 24 further including receiving a voltage drop across the degeneration block biasing resistor at a first input and generating the replica device bias signal for the replica device based upon a difference between the first input and a second input coupled to a node disposed between the first current source and the replica device.

* * * * *